May 6, 1969 R. KASHKIN ET AL 3,443,233
HIGH IDLER DIODE PARAMETRIC AMPLIFIER
Filed May 21, 1968

INVENTORS.
RONALD KASHKIN
PETER P. LOMBARDO
HARRY POMERANZ

BY Henry Hugo
ATTORNEY.

3,443,233
Patented May 6, 1969

3,443,233

HIGH IDLER DIODE PARAMETRIC AMPLIFIER

Ronald Kashkin, Melville, Peter P. Lombardo, Huntington, and Harry Pomeranz, Hauppauge, N.Y., assignors to Cutler-Hammer, Inc., Milwaukee, Wis., a corporation of Delaware Filed May 21, 1968, Ser. No. 730,724
Int. Cl. H03f *7/04*
U.S. Cl. 330—4.9 3 Claims

ABSTRACT OF THE DISCLOSURE

A parametric amplifier using a varactor diode operating in parallel self-resonance at the idler frequency. The diode is mounted within a radial line filter that confines the idler energy. Signal connection to the diode is made through a coaxial line having a relatively high impedance section with its center conductor entering the radial line and serving as a tuning inductance to series resonate the varactor capacitance at the signal frequency. Pump power is supplied at an aperture on the periphery of the radial line, through a waveguide which is cutoff to the idler frequency.

BACKGROUND

*Field*

The invention relates to parametric amplifiers of the type in which a semiconductor diode is operated as a variable capacitor. A high frequency pump voltage applied to the diode causes it to exhibit negative resistance to signal energy of a substantially lower frequency, causing reflection of the signal with amplification.

*Prior art*

Prior art parametric amplifiers are illustrated by the following United States patents: 3,040,267, Seidel, June 19, 1962; 3,105,941, Kliphuis, Oct. 1, 1963; 3,127,566, Lombardo, Mar. 31, 1964.

Some theoretical aspects of such amplifiers are discussed in Greene et al.; Proceedings of the IRE, September 1960, pages 1583–1590. A more general and less mathematical discussion appears in the Bell Telephone System Monograph 3784 by E. D. Reed, published in 1961.

The foregoing references represent the most pertiment prior art presently known to applicants. They describe various approaches to improving the bandwidth and noise characteristics of diode parametric amplifiers while maintaining the required isolation between the signal, pump and idler components.

Theory and practice have demonstrated that ideally the following conditions should be met:

(a) The idler circuit loading should consist only of the diode loss.

(b) The diode should be self-resonant at the idler frequency.

(c) The idler frequency should be as high as is practicable.

The Seidel patent is directed to broadbanding a parametric amplifier by placing a band pass transmission network between the signal circuit and the diode. The network also isolates the pump and idler from the signal circuit. However, none of the three conditions listed above is considered or satisfied.

Lombardo operates with the diode in series resonance at the idler frequency, and supplies pump power to it through a quarter wavelength transmission line from a high impedance source. Both the diode and the end of the quarter wavelength line connected to it act as very low impedances at the idler frequency, thereby tending to isolate the idler from the relatively higher impedance signal circuit. This arrangement meets the above conditions to some extent, but adds undesirable reactances that degrade the bandwidth, and limits the idler to the relatively low series self-resonance frequency of the diode.

Kliphuis uses two diodes in a balanced arrangement that provides geometrical isolation of the idler from the signal circuit. The diodes must be matched to each other, and they operate in series self-resonance at the idler frequency, as in Lombardo.

SUMMARY

According to this invention, the diode is operated in its parallel self-resonant high impedance mode at the idler frequency. A radial line filler is designed to present an open circuit to the flow of idler energy into the signal circuit. The diode is located inside the filter at its high impedance region and thus experiences essentially free space environment at the idler frequency. The absence of undesired reactances and the absence of accompanying need for tuning devices results in broad instantaneous bandwidth, and facilitates electronic tuning by variation of D-C bias on the diode.

It has been shown theoretically that there is an optimum pump frequency, and hence an optimum idler frequency, for minimum noise generation in a parametric amplifier. In practice, these frequencies are higher than the series self-resonant frequencies of available diodes. The parallel self-resonant frequency is substantially higher than the series self-resonant frequency, and therefore closer to the theoretically optimum idler frequency.

The diode is also series resonated at the signal frequency by means of an external inductance provided by a short high impedance section in the signal line adjacent is connection to the didode. This arrangement enables efficient coupling of signal energy to and from the diode without affecting the idler circuit.

The described structure requires no precise adjustments to be made or maintained, is easily fabricated and assembled, and is resistant to mechanical shock and vibration.

DRAWING

DESCRIPTION

Figure 1:
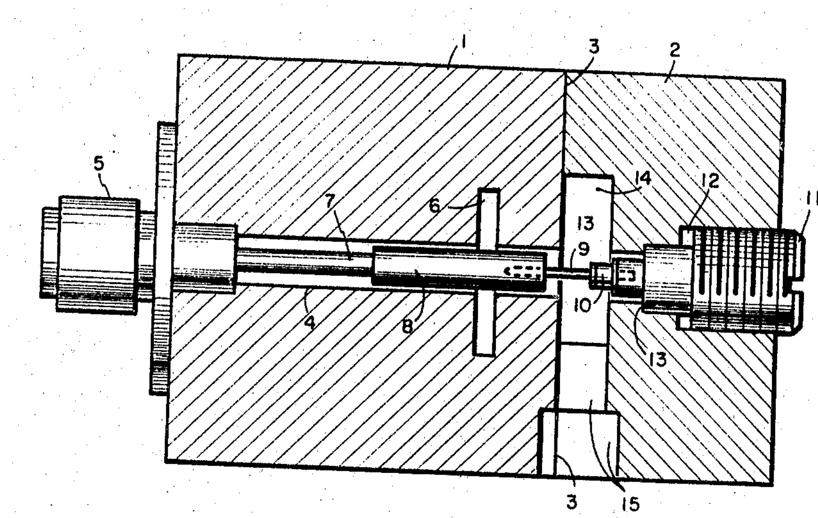
FIGURE 1 is a view in longitudinal section of a preferred embodiment of the invention.

The main body portion of the structure of FIGURE 1 may be fabricated by separately machining metal blocks 1 and 2 to form the required internal cavities and openings, and then joining their matching surfaces at the plane 3. A longitudinal bore 4 in the block 1 provides the outer conductor of a coaxial line extending leftward to a coaxial connector fitting 5. The fitting 5 is adapted to engage a mating fitting for connection to the usual external signal circuit means, not shown.

A radial groove 6 extends outwardly from the bore 4, to a depth that is electrically equivalent to one quarter wavelength at the pump frequency. The groove 6 is located at an axial distance of one quarter the pump wavelength from the plane 3. The groove acts as a radial transmission line short circuited at its outer end, presenting an open circuit to the pump frequency in the outer conductor of the coaxial line. This open circuit is inverted to a short circuit across the coaxial line at the plane 3, thus preventing transmission of pump energy into the signal circuit.

The inner conductor of the coaxial line includes sections 7 and 8 of successively larger diameters, each one quarter wavelength long at the signal frequency, for transforming the impedance of the external signal circuit to the relatively lower impedance of the varactor diode at signal frequency. The inner conductor terminates in a short small diameter section 9, designed to act as an inductance which is series resonant with the average capacitance of the varactor diode at the signal frequency.

The varactor 10 is mounted on the end of a removable plug 11 secured in the block 2 in a central bore 12 that is aligned with the bore 4 when the device is assembled. The plug 11 and bore 12 have complementary shoulders that engage at 13 for precisely maintaining the position of the varactor longitudinally of the structure.

Figure 2:
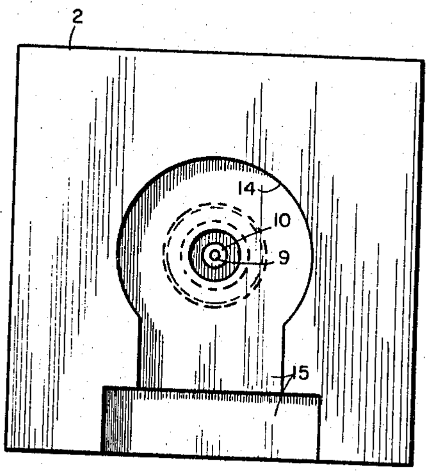
FIGURE 2 is an end view of the right hand portion of the structure of FIGURE 1, looking toward the right in FIGURE 1.

A radial line 14, similar to the pump filter 6 but somewhat larger, surrounds the varactor 10 and the adjacent portion of the conductor 9. The radius of line 14 is electrically equivalent to one quarter wavelength at the idler frequency. A rectangular waveguide 15 enters the periphery of the line 14 for conveying pump power from an external source, not shown, to the interior of the line 14. The waveguide 15 is dimensioned to be beyond cutoff at the idler frequency, and includes steps as shown to impedance match the pump source to the varactor diode at the pump frequency. The line 14 and guide 15 may be made by forming the block 2 as shown in FIGURE 2 before assembly.

Figure 3:
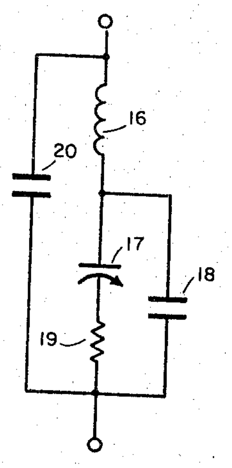
FIGURE 3 is an equivalent circuit of a varactor diode.

Referring to FIGURE 3, the inductor 16 represents the internal lead inductance of the varactor. The capacitor 17 represents the junction capacitance, which varies with respect to some quiescent value $C_0$ as a function of the voltage across it. The capacitor 18 represents the stray capacitance across the junction, and the resistor 19 the total series resistance of the varactor. The capacitor 20 represents the case capacitance, which is a stray capacitance effectively between the external terminals of the varactor. All of the foregoing elements are more or less distributed in nature, but may be considered lumped as shown with sufficient accuracy.

The varactor is series self-resonant to the frequency at which the magnitudes of reactance of inductor 16 equals that of capacitors 17 and 18 in parallel with each other, that is, the lead inductance resonates with the sum of the junction capacitance and the stray capacitance across the junction. Parallel self-resonance occurs at the frequency at which the magnitude of the lead reactance equals that of the case capacitance 20 in series with the parallel combination of the junction capacitance 17 and stray capacitance 18. Presently available varactor diodes may exhibit series self-resonance at frequencies of about 20 gHz., and parallel self-resonance at about 35 gHz.

In operation, the signal to be amplified is applied by way of the connector 5 (FIGURE 1) to the coaxial line, and thence to the varactor 10. Pump power is supplied through the waveguide 15 to the radial line 14, producing a field therein that induces a voltage at the pump frequency across the varactor. This causes the varactor to exhibit negative resistance to the signal, and reflect amplified signal which is transmitted by the coaxial line to the external signal circuit. The radial line filter 6 prevents escape of pump energy into the coaxial line.

As a necessary part of the amplification process, the varactor converts some of the incident pump power into idler power. The idler frequency is the difference between the pump and signal frequencies. In the practice of this invention, the varactor is operated in parallel self-resonance at the idler frequency. Accordingly, the pump frequency is made equal to the sum of the midband signal frequency and the parallel self-resonant frequency of the varactor.

The radial line 14 acts with regard to the idler energy in the same manner as the line 6 does with the pump energy, that is, it presents an open circuit to the coaxial line. Viewed from the coaxial line, the left-hand wall of the line 14 is electrically isolated from the right hand wall at the idler frequency, and there is no path for idler energy between the varactor and the outer conductor of the coaxial line.

Because the idler energy cannot escape through the coaxial line or through the cutoff waveguide 15, it is confined to the radial line filter 14, where it exists as a standing wave with its voltage maximum at the center. At this point, where the varactor is located, the line 14 presents essentially infinite impedance at the idler frequency. The varactor experiences substantially free space environment with respect to idler energy, and substantially the only dissipation of idler energy is that due to the internal resistance of the varactor.

A parametric amplifier of the described type was designed to operate over a range of signal frequencies from 7.25 to 7.75 gHz., with signal tuning effected by adjustment of a D-C bias applied to the varactor by way of the signal circuit in known manner. The varactor was parallel self-resonant at 34.5 gHz. and the pump frequency was 42 gHz. The measured performance at room temperature was:

| | |
|---|---|
| Gain | 18 db. |
| Instantaneous bandwidth | 150 mHz. at 3 db points. |
| Effective noise temperature | 100° K. |

We claim:

1. A parametric amplifier including a varactor diode, means including a coaxial transmission line for conducting signal to said diode and amplified signal away from said diode, and means for supplying pump power to said diode, wherein the improvement consists in that;

(a) the diode exhibits parallel self-resonance at the idler frequency, (b) a radial transmission line is provided at the end of said coaxial line adjacent said diode, said radial line being short-circuited at its periphery and having an electrical length of one quarter wavelength at the idler frequency, and (c) said diode is disposed centrally within said radial line and connected between the end of the inner conductor of said coaxial line and the center of the opposed conductor of said radial line.

2. The invention set forth in claim 1, wherein said inner conductor of said coaxial line includes a reduced diameter section adjacent said diode, proportioned to act as an inductance that series resonates with said diode at the signal frequency.

3. The invention set forth in claim 1, wherein said means for supplying pump energy to said diode includes a waveguide that enters the periphery of said radial transmission line and is proportioned to be cut off at the idler frequency.

References Cited

FOREIGN PATENTS 1,019,393 2/1966 Great Britain.

JOHN KOMINSKI, *Primary Examiner.*

DARWIN R. HOSTETTER, *Assistant Examiner.*

U.S. Cl. X.R.

330—56